(12) United States Patent
Taboada et al.

(10) Patent No.: US 12,379,511 B2
(45) Date of Patent: Aug. 5, 2025

(54) RADIATION DETECTOR AND METHOD OF MANUFACTURE THEREOF

(71) Applicant: DECTRIS AG, Baden-Dättwil (CH)

(72) Inventors: Alfonso Gonzalez Taboada, Dättwil (CH); Pietro Zambon, Dättwil (CH); Michael Rissi, Dättwil (CH); Roger Schnyder, Dättwil (CH); Michal Bochenek, Dättwil (CH); Arne Jensen, Dättwil (CH)

(73) Assignee: DECTRIS AG, Baden-Dättwil (CH)

( * ) Notice: Subject to any disclaimer, the term of this patent is extended or adjusted under 35 U.S.C. 154(b) by 356 days.

(21) Appl. No.: 17/998,732

(22) PCT Filed: May 13, 2020

(86) PCT No.: PCT/EP2020/063360
§ 371 (c)(1),
(2) Date: Nov. 14, 2022

(87) PCT Pub. No.: WO2021/228386
PCT Pub. Date: Nov. 18, 2021

(65) Prior Publication Data
US 2023/0333267 A1    Oct. 19, 2023

(51) Int. Cl.
*G01T 1/24* (2006.01)
*G01T 1/17* (2006.01)
(Continued)

(52) U.S. Cl.
CPC .............. *G01T 1/247* (2013.01); *G01T 1/17* (2013.01); *G01T 1/20183* (2020.05);
(Continued)

(58) Field of Classification Search
CPC ....... G01T 1/17; G01T 1/20183; G01T 1/247; H01L 24/16; H01L 24/48;
(Continued)

(56) References Cited

U.S. PATENT DOCUMENTS

2016/0276394 A1  9/2016  Chou et al.
2019/0280036 A1  9/2019  Herrmann et al.

FOREIGN PATENT DOCUMENTS

JP  2006019486 A  1/2006
JP  2009078143 A  4/2009

OTHER PUBLICATIONS

International Search Report and Written Opinion for corresponding Application No. PCT/EP2020/063360 issued Jan. 18, 2021.

*Primary Examiner* — Mark R Gaworecki
(74) *Attorney, Agent, or Firm* — Renner, Otto, Boisselle & Sklar, LLP

(57) ABSTRACT

A radiation detector for position-resolved detection of radiation and a method of manufacturing. The radiation detector comprises at least one sensor tile with sensor material sensitive to the radiation defining a horizontal plane; a set of pixels of electrically conducting material in contact with the sensor material; at least one ASIC with input contacts in electrical connection with the pixels, wherein at least one input contact is horizontally offset relative to a corresponding pixel; and a redistribution layer between the at least one sensor tile and the at least one ASIC, the redistribution layer comprising conductor tracks electrically connecting the input contacts with the corresponding pixels. At least one of the conductor tracks crosses at least one crossed pixel different from the corresponding pixel. At least one crossed pixel has a void of the electrically conducting material corresponding to at least a portion of projections of the conductor tracks.

20 Claims, 14 Drawing Sheets

(51) Int. Cl.
  *G01T 1/20*   (2006.01)
  *H01L 23/00*  (2006.01)
  *H01L 23/48*  (2006.01)
  *H10F 39/00*  (2025.01)
  *H10F 39/12*  (2025.01)
  *H10F 39/18*  (2025.01)

(52) U.S. Cl.
  CPC ........... *H01L 24/48* (2013.01); *H10F 39/018* (2025.01); *H10F 39/1898* (2025.01); *H10F 39/809* (2025.01); *H10F 39/811* (2025.01); *H01L 24/16* (2013.01); *H01L 2224/16145* (2013.01); *H01L 2224/48227* (2013.01)

(58) Field of Classification Search
  CPC . H01L 2224/16145; H01L 2224/48227; H10F 39/018; H10F 39/1898; H10F 39/809; H10F 39/811
  See application file for complete search history.

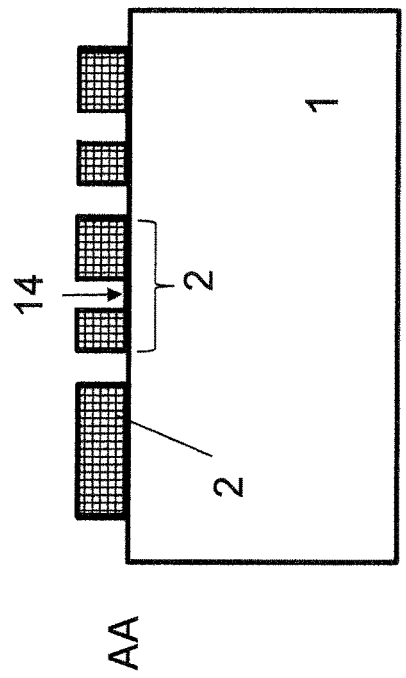
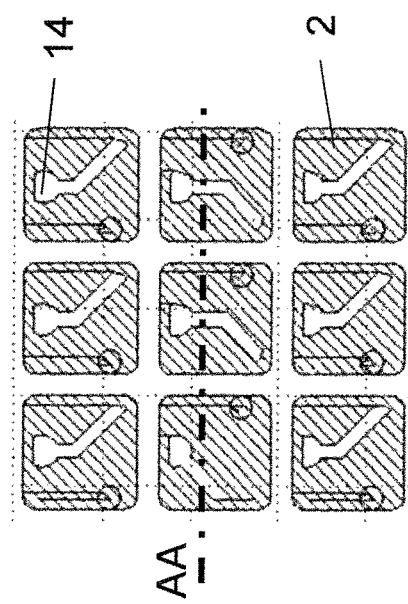
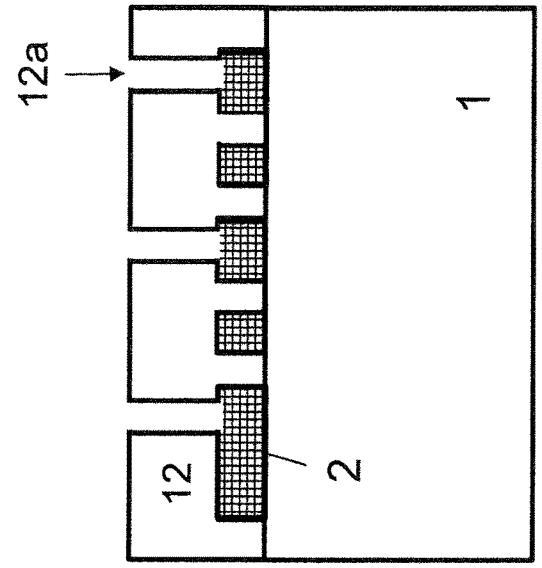
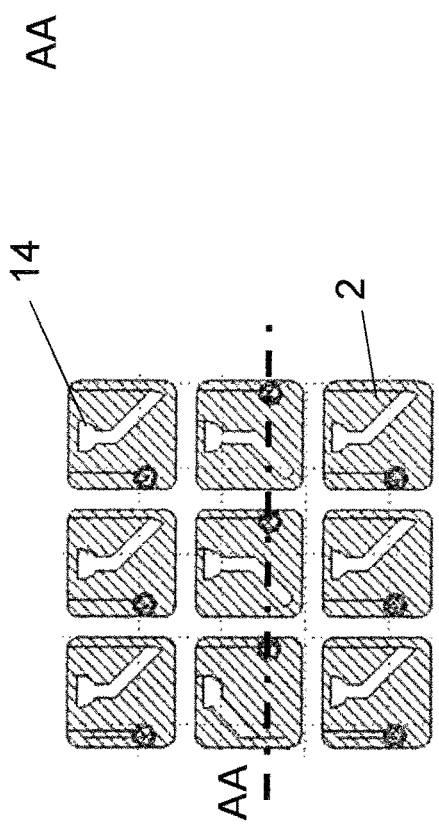
Fig. 13a  Fig. 13b
Fig. 14a  Fig. 14b

RADIATION DETECTOR AND METHOD OF MANUFACTURE THEREOF

This application is a national phase of International Application No. PCT/EP2020/063360 filed May 13, 2020, which is hereby incorporated herein by reference in its entirety.

TECHNICAL FIELD

The invention concerns a radiation detector for position-resolved detection of radiation as well as a method of manufacturing such detector.

BACKGROUND ART

Radiation detectors are mainly used for the detection of electromagnetic radiation e.g. in the X-ray band, or electrons with energies e.g. between 1 keV and 400 keV. For some applications, a position-resolved detection of the radiation is required, e.g. in medical applications such as X-ray measurements or computed tomography (CT) scans for e.g. mammography or angiography, or e.g. in electron microscopes for applications like cryogenic electron microscopy (Cryo-EM), scanning electron microscopy (SEM), transmission electron microscopy (TEM) or scanning transmission electron microscopy (STEM)

A well-known class of detectors are semiconductor detectors which either directly or indirectly convert incident radiation, i.e. incident photons or electrons, to an electrical charge proportional to the absorbed energy. A semiconductor radiation detector can be built up from detector modules. Each module is composed of one or several semiconductor sensor tiles and one or multiple readout application specific integrated circuits (ASICs). The photons or electrons are thus converted to electrical charge in the semiconductor sensor tile. The electrical charge is then evaluated e.g. in terms of a position-resolved image of the incident radiation. In case of photon or electron counting detector, the evaluation of the electrical charge, completed at the ASIC, includes counting the number of charge pulses above a certain threshold within a time frame.

"Position-resolved" means that the detector determines the amount of radiation, e.g. a number of photons, a number of electrons, or deposited energy, per location in space. For that purpose, space of sensitive material is usually discretized in pixels represented by areas of electrically conducting material defined on the sensor tile surface. In another embodiment, pixel may refer to a corresponding area defined by an electrically conducting diffusion layer on the sensor layer with a metal contact on top (with the diffusion layer e.g. being part of PIN diode structure formed inside e.g. a sensor layer of silicon). The bottom surface of the sensor tile includes a periodic array of pixels. A distance between neighbor pixels is defined as "pitch". The detector spatial resolution depends on the size and spacing of the pixels. The smaller the pixel in which incident photons or electrons are detected, the smaller can usually the pixel pitch be. The higher the number of pixels per sensor tile area, the better the spatial resolution.

Each pixel is electrically connected to an input contact of a readout ASIC, e.g. by means of solder bumps. The top side of the ASIC includes an array of input contacts. The pitch of the input contacts in the ASIC is defined as the distance between adjacent input contacts. Usually the pitch of the input contacts is uniform across the ASIC. In case the input contacts do not completely cover the ASIC, such pitch uniformity may be broken between neighboring input contacts lying at the edge of adjacent ASICs.

The pitch between two regular input contacts may preferably be between 20 μm and 500 μm. In conventional semiconductor radiation detectors, the electrical connection between pixels and input contacts is direct, i.e. the sensor pixel pitch and ASIC input contact pitch are identical and the input contacts and the corresponding pixels are located directly opposite to each other.

Multiple detector modules can be assembled side by side such that radiation in an area larger than the area of a single detector module is registered. In the region where adjacent modules are joined, a gap occurs, where no radiation will be detected.

Further, the quality of the space-resolved detection also depends on further factors. In state of the art semiconductor detectors, the charge created by the incident radiation is converted to a voltage in an ASIC with a charge sensitive amplifier. The amplitude of the resulting voltage signal as well as its underlying noise level are strongly influenced by the capacitance at the input of the amplifier. Optimal performance of a semiconductor detector is achieved, when the noise is as low as possible, and the signal as large as possible. As the signal-to-noise ratio determines basic detector performance parameters like e.g. the response of the detector to low energy radiation, it is important to have a uniform and high signal-to-noise ratio of the voltage signal over the full detector. In order to ensure a high and uniform signal-to-noise ratio, it is necessary to reduce the capacitance at the input of the charge sensitive amplifier, and to achieve a uniform capacitance distribution over the full detector. Further noise sources from ambient noise sources need to be reduced as well, as they further decrease the signal-to-noise ratio.

Generally it is desired to have a radiation detector that covers an area without or at least reduced insensitive gaps and without or at least reduced deviations on the pixel pitch between detector modules, sensor tiles or in the region between two ASICs. This is particularly important for imaging applications, e.g. for medical applications or for electron imaging applications. Conventional radiation detectors exhibit gaps between detector modules and/or a different pitch between neighboring pixels corresponding to neighboring input contacts in adjacent ASICs. Radiation or photons which hit the gap between two detector modules or sensor tiles are actually not incident on a pixel and hence not detected. This leads to the loss of a fraction of the incoming radiation. Furthermore, the input contacts periodicity distortion between neighboring ASICs lead to local variations of the detector spatial resolution when x-rays or electrons hit the region between two ASICs. It is hence an object of the invention to provide a radiation detector with high resolution covering a large area without or at least minimized gaps and without or at least reduced pixel pitch variation in the junction between ASICs, sensor tiles and/or detector modules. The invention may have particular impact in x-ray or electron imaging applications.

DISCLOSURE OF THE INVENTION

The object is achieved by a radiation detector for position-resolved detection of radiation which comprises the following elements:
- at least one sensor tile with sensor material sensitive to the radiation, defining a horizontal plane: The sensor tile may have a rectangular or in particular quadratic shape in the horizontal plane with a side length of e.g. 2 cm or 4 cm or 6 cm or 8 cm. The radiation is X-ray radiation with typical energies between 2 keV and 200 keV, or electron radiation with energies between 2 keV and 400 keV. X-radiation for medical applications typically has an energy in the range of 5 to 100 keV or up to 200 keV. Suitable semiconductor sensor materials are silicon, gallium arsenide, cadmium telluride or cadmium zinc telluride. The sensor material is preferably adapted to convert incident radiation or an incident photon to electrical charge, which can then be measured.

a set of pixels of electrically conducting material in contact with the sensor material: A pixel is defined as a surface area in the horizontal plane, typically made of metal. Any electrical charge induced in the pixel, and in particular originating from a converted photon or electron, contributes to a measurement value of the pixel. Hence, the detector spatial resolution, i.e. the number of pixels or measurement values per unit area, depends on the pixel pitch. Preferably the pixels are rectangular and in particular quadratic with a side length typically between 20 and 1000 µm, ideally between 30 and 450 µm. The set of pixels may be a grid-like arrangement, e.g. a rectangular grid, ideally covering a large fraction of the sensitive material of the sensor tile, e.g. at least 90%, 95% or 99%.

at least one ASIC with input contacts in electrical connection with the pixels, wherein at least one input contact is horizontally offset relative to a corresponding pixel: Each input contact is preferably connected with exactly one corresponding pixel, meaning that a number of pixels of the set is preferably equal to a number of input contacts. Preferably one or multiple ASICs correspond to, i.e. evaluate all signals of one sensor tile. The one or more ASICs are preferably configured to evaluate an electrical signal collected on the pixels in contact with the ASICs input contacts. In particular evaluating may comprise at least one or more of determining an amount of electrical charge per pixel and time, counting a number of incident photons or electrons above a given signal threshold converted to electrical charge per pixel and time, and further processing such as calibration. Preferably, the at least one ASIC assigned per sensor tile is arranged in a plane parallel to the horizontal plane defined by the sensor tile, and preferably is arranged in a stack together with the sensor tile and possibly other components such as the redistribution layer introduced below. Preferably, the input contacts of the ASIC face the pixels even though other components may be arranged in between. For a simple attribution of input contacts to pixels, it would be desirable to have each input contact "directly below", i.e. without any horizontal offset to the corresponding pixel. This, however, may not be possible because of a different size of the sensor tile compared to the size of the ASIC/s or because of space under the sensor tile and horizontally besides the input contacts that is required for other elements such as input/output (I/O) pads for reading out the ASIC/s, setting parameters of the ASIC/s or providing power or reference voltages to the ASIC/s.

a redistribution layer between the at least one sensor tile and the at least one ASIC, the redistribution layer comprising conductor tracks electrically connecting the pixels with a contact array located in a plane parallel to the sensor surface, preferably with a pitch identical to the pitch of the input contacts of the ASIC: In other words, the redistribution layer facilitates an electrical and preferably also mechanical connection between the sensor tile and the ASIC. In view of each input contact preferably being connected with exactly one corresponding pixel, the redistribution layer provides one conductor track per pair of pixel/input contact. Such conductor track preferably has only one or more horizontal portions, and one or more vertical portions referred to as vias. Preferably the conductor tracks connect the pixels through under bump metallization (UBM) contacts and solder bumps to the input contacts of the at least one ASIC.

In the radiation detector according to the invention, at least one of the conductor tracks crosses at least one crossed pixel different from the corresponding pixel. This means that such conductor track crosses at least one pixel, the "crossed pixel", which may and should detect different signals from photons or electrons than the corresponding pixel. Preferably, the crossing conductor track connects to the corresponding input contact horizontally offset from the corresponding pixel, and thereby crosses one or more different crossed pixels. Preferably, a crossed pixel is a neighbor pixel to the corresponding pixel.

The crossing as implemented in conventional detectors leads to the problem of capacitive coupling between signals of different pixels, i.e. photons and electrical charge detected by the corresponding pixel affect the signal of the crossed pixel, also called crosstalk between pixels. This deteriorates signal quality. In particular, the crossing leads to so-called parasitic capacitances between the corresponding pixel and the at least one crossed pixel. Furthermore, as this parasitic capacitance depends on the location and geometry of the crossed pixel, not every pixel will see the same input capacitance at the ASIC amplifier, leading to a non-uniform signal-to-noise ratio.

In the radiation detector according to the invention, this problem is avoided or at least minimized in the following way: The at least one crossed pixel has a void of the electrically conducting material corresponding to at least a portion of the projection of the crossing conductor track. Projection means an area on the crossed pixel where the conductor track is projected vertically, i.e. orthogonal to a surface of the pixel in the horizontal plane, onto the crossed pixel. While the pixel 3C is of electrically conducting material, it preferably does not have any electrically conducting material within at least a portion of the projection. This means that the pixel, which otherwise may be rectangular or quadratic, may have a hole corresponding to at least a portion of the projection.

Such pixel design avoids or at least minimizes the parasitic capacitance between a crossed pixel and the pixel corresponding to a certain input contact of the ASIC or to a certain conductor track, respectively. In addition, a more uniform input capacitance distribution is reached at the ASIC input contacts. This can be understood when considering the simplified example of a parallel-plate capacitor whose capacitance C is given as $C=\varepsilon A/d$ with the permittivity $\varepsilon$ of material between the plates, the plate area A, and the plate distance d. It follows that the larger the plate area A, the larger is the capacitance C, which in the present case is an undesired parasitic capacitance. Hence avoiding plate areas A opposite to each other as in a parallel-plate capacitor, as is done according to the present invention with the void in the at least one crossed pixel, minimizes a parasitic capacitance.

Preferably, each pixel of the tile is a crossed pixel and has a void from a crossing conductor track. Such design reflects a highly compacted arrangement of input contacts on the ASIC. In general, designing pixels according to the present invention enables in particular to make the redistribution layer thinner, e.g. with a thickness of between 0.1 and 10 µm, which is equivalent to making the plate distance d in the above formula smaller, without enlarging parasitic capacitances and deterioration measurement quality.

At the same time, the pixel design according to the invention allows to vary the ASIC size and/or shape independent of a size and/or shape of the sensor tile. This yields various possibilities for designing the radiation detector. In particular, it facilitates a reduction of gaps, in particular gap width, between tiles, while keeping the pixel pitch constant. In this way, less radiation or photons passes through the detector undetected, and the effective resolution will not be distorted in regions between adjacent ASICs or adjacent sensor tiles.

Horizontal offset between a pixel and the corresponding input contact on the ASIC preferably refers to a location of the input contact on the one hand, and to a location of a termination point of the conductor track within an area of the corresponding pixel on the other hand. Given the size of a pixel, the termination point may lie in different regions of the pixel as desired. Hence, designing the termination point in the area of a pixel, e.g. per pixel, may in addition serve to reduce crosstalk. In one embodiment, at least two pixels of the set of pixels have different termination points within the respective pixels. Preferably, at least one, and preferably all of the termination points are located at the edges of the corresponding pixel areas. In case the corresponding conductor track is led right to the neighboring gap, crosstalk can be minimized in this way, too. Preferably, a combination of the aforementioned two embodiments is applied. Termination points are preferably only arranged at edges of the pixels, however, at different edges. For example, termination points may be on a right hand edge of pixels of a first subset while termination points may be on a left hand edge of pixels of a second subset Further advantageous features according to the invention are as follows:

The at least one sensor tile preferably has a larger surface area in the horizontal plane than the at least one ASIC. Further, the at least one sensor tile protrudes over at least one edge of the at least one ASIC assigned, in its projection on the at least one ASIC. More preferably, the at least one sensor tile has a larger surface area in the horizontal plane than the at least one ASIC assigned. In particular, a horizontal extension of the set of pixels is larger than an extension of the array of input contacts.

This means that there is some space in the ASIC, below the sensor tile and besides the ASIC input contacts array which may be used for different elements, e.g. for input/output (I/O) pads of the ASIC. Thus neighboring tiles can be arranged closer together, hence avoiding undesired gaps between sensor tiles. In an embodiment, each sensor tile has a surface area of at least 2 cm×2 cm.

In a preferred embodiment, the radiation detector comprises a set of sensor tiles and/or modules arranged adjacent to each other in the horizontal plane, wherein the tiles and/or modules are separated by gaps. An overall surface of the gaps in the horizontal plane is preferably smaller than 10%, in particular smaller than 5% or 1%, of an overall surface of the tiles and/or modules.

In a preferred embodiment, for collecting the charge generated inside the semiconductor sensor tile an electric field (bias voltage) is applied across the semiconductor sensor tile. To create the electric field a high-voltage (HV) preferably is applied on the side of sensor tile that faces the incident radiation. The HV is typically applied to a metal electrode on the sensor tile e.g. via a wire bond to the metal electrode or via a wire bond connected to a conductive tape on the electrode or using conductive tape for connecting directly to the electrode or to the semiconductor.

Further, an area of the void preferably amounts to at least 80%, in particular at least 90%, of an area of the projections, which area defines the portion of the projection. While the void may be differently shaped and in particular larger or smaller than the projections, it is advantageous that the void occupies at least said portion of the projections in order to minimize parasitic capacitances.

A/the void/s are preferably delimited by continuous edges of electrically conducting material. This means that the void in particular is a hole through the pixel, and not only a recess in the pixel. In an embodiment, the void covers the whole area of the projection but not the edge of the pixel which is left as a continuous electrical connection. Such pixel design makes sure that all parts of a pixel are on the same potential, in particular in the case where a projection would otherwise cut a crossed pixel into two or more parts.

Parasitic capacitances may alternatively or additionally be minimized or avoided in other ways according to the above formula, namely by changing the permittivity ε of material between the plates, i.e. between the conductor track and the crossed pixel, and or by changing the plate distance d, i.e. the distance between the conductor track and the crossed pixel which is in particular similar to the thickness of the redistribution layer. According to this idea, it is advantageous that the redistribution layer has a thickness of at least 1 µm, in particular at least 5 µm. Moreover it is advantageous that the redistribution layer comprises a low-k material, meaning a material, particularly a dielectric, with a relative permittivity of $\varepsilon_r < 3.9$. Preferable examples for the low-k material are e.g. porous SiO2, F-doped SiO2, Polyamide.

In a further embodiment, the radiation detector comprises a substrate for holding and contacting the at least one ASIC. The substrate may comprise an electric insulator substrate and an external conductive via through the insulator substrate, e.g. one external conductive via per ASIC. In particular an I/O pad of the at least one ASIC is electrically connected to the external conductive via, in particular by printed micro wire or by tab bonding or by wire bonding. Hence the substrate preferably acts as a holder and in particular facilitates mounting more than one ASIC and at least one module on one radiation detector.

In yet another embodiment, the radiation detector further comprises a shield between the redistribution layer and the at least one ASIC. The shield preferably is arranged on the redistribution layer and preferably faces at least one of an I/O pad of the ASIC or a conductive via of an electric insulator substrate holding the ASIC. The shield is preferably electrically conducting and connected to ground. The shield serves to avoid or at least minimize the crosstalk between digital or analog signals routed inside, to or from the I/O pads of the ASIC and the conductor tracks in the redistribution layer or the pixels. It is advantageous that a projection of the shield covers at least 50%, in particular at least 80%, of a surface area of the ASIC that is not covered by input contacts.

According to another aspect of the invention, a method of manufacturing a radiation detector is provided. It comprises the steps of providing at least one sensor tile comprising a sensor material sensitive to the radiation, forming a set of pixels of electrically conducting material in contact with the sensor material, in particular by applying photolithography and metallization, depositing a dielectric coating layer, in particular contributing to a redistribution layer, etching a via hole per pixel into the dielectric coating layer, forming conductor tracks by filling the via holes with an electrically conducting material defining redistribution tracks on the dielectric coating layer, in particular by applying photolithography and metallization, defining contacts of the conductor tracks, in particular by UBM, and depositing another dielectric coating layer on the redistribution tracks, in particular the other dielectric coating layer also contributing to the redistribution layer, and electrically connecting the contacts of the conductor tracks to input contacts of at least one ASIC.

The at least one input contact is horizontally offset relative to a corresponding pixel. At least one of the conductor tracks crosses at least one crossed pixel different from the corresponding pixel. And at least one crossed pixel has a void of the electrically conducting material corresponding to at least a portion of projections of the conductor tracks.

Further it is advantageous that the method comprises at least one of the following steps:

arranging a set of tiles adjacent to each other in a horizontal plane, wherein the tiles are separated by gaps, wherein an overall surface of the gaps in the horizontal plane is smaller than 10%, in particular smaller than 5% or 1%, of an overall surface of the tiles, providing a substrate for holding and contacting the at least one ASIC, in particular wherein the substrate comprises a electric insulator substrate and an external conductive via through the insulator substrate per ASIC, mounting the at least one tile and the at least one ASIC to the substrate, electrically connecting an I/O pad of the at least one ASIC to the external conductive via, in particular by printed micro wire or by tab bonding or by wire bonding.

The described embodiments and features similarly pertain to the radiation detector and to the method. Synergetic effects may arise from different combinations of the embodiments and features although they might not be described in detail.

BRIEF DESCRIPTION OF THE DRAWINGS

The invention will be better understood and objects other than those set forth above will become apparent when consideration is given to the following detailed description thereof. Such description makes reference to the annexed drawings, wherein:

FIG. 3a shows detector modules composed by a sensor tile per ASIC, whereas in FIG. 3b, several ASICs are connected to one sensor tile;

FIGS. 13 to 16 show photolithography masks (FIGS. 13a to 16a) and cross-sections of a radiation detector (FIGS. 13b to 16b) as used and obtained in a method of manufacturing a radiation detector according to an embodiment of the invention;

MODES FOR CARRYING OUT THE INVENTION

For a better understanding of the problem as well as its solution according to the invention, first features of state-of-the-art radiation detectors are described by means of FIGS. 1 to 7.

Figure 1:
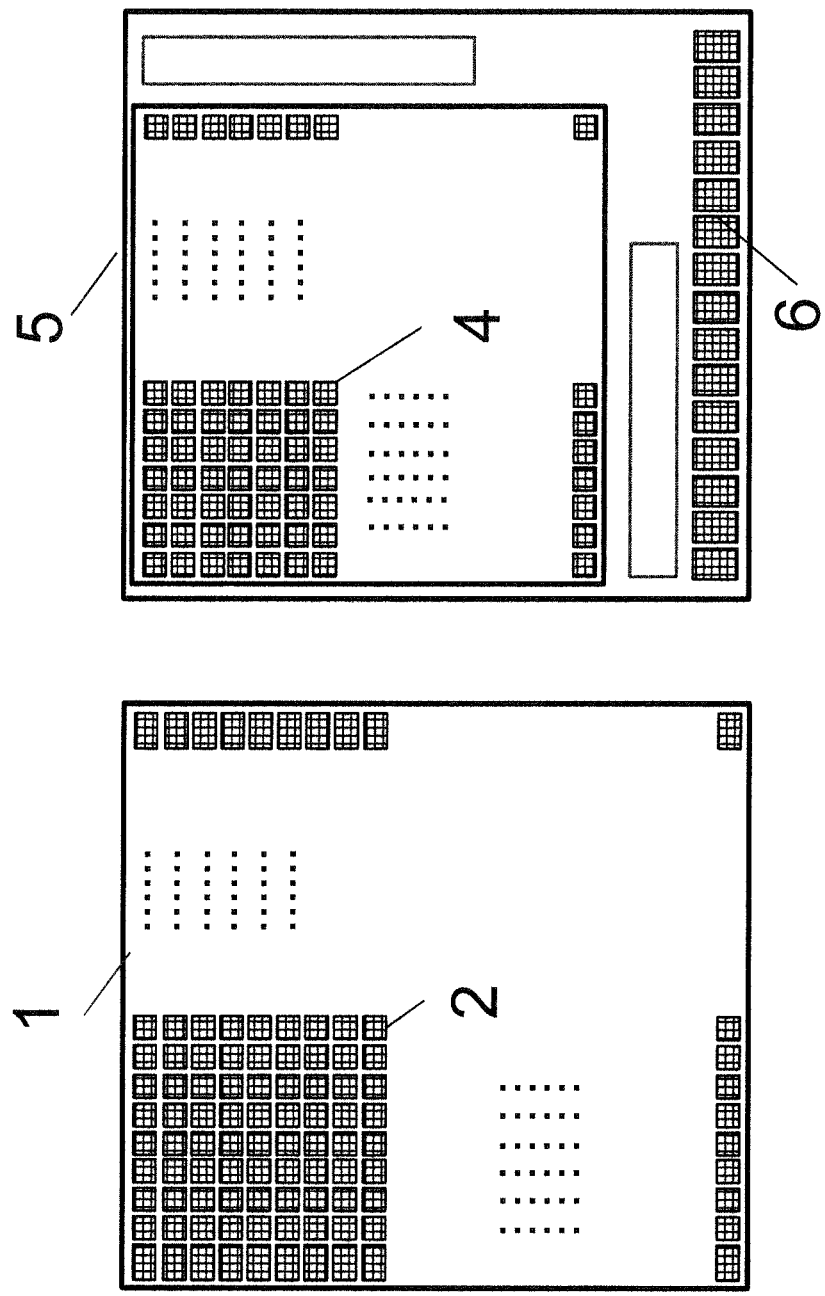
FIG. 1 shows a pixelated sensor tile (on the left) and an ASIC containing an array of input contacts (on the right) of a radiation detector according to the state of the art.

FIG. 1 shows a pixelated sensor (on the left) and an ASIC containing an array of input contacts (on the right) of a radiation detector according to the state of the art. At least one pixelated sensor tile 1 or an array of sensor tiles and at least one ASIC 5 or an array of ASICs 5 constitute a radiation detector module, where one or multiple radiation detector modules constitute the radiation detector. An array of pixels 2 contacting the sensor material, which is sensitive to the radiation, in FIG. 1 has a size of 256×256 pixels. The pixelated ASIC 5 (on the right of FIG. 1) has the same number of input contacts 4 as the pixelated sensor has pixels, i.e. 256×256. Further, the ASIC 5 comprises I/O pads 6 for in-put/output of electrical signals and peripheral circuitry, such as control blocks and guard rings, which consume a part of the ASIC surface.

Typically, the pixels 2 and the input contacts 4 of the ASIC 5 are electrically connected to each other in a one-to-one relationship of pixels and corresponding input contacts, meaning that the number of input contacts 4 is equal to the number of pixels 2. For simplicity, corresponding pixels 2 and input contacts 4 are located adjacent to each other. In state of the art radiation detectors, the pixels in the outermost row and outermost column of the pixel matrix are usually larger than regular pixels within the pixel matrix, in order to cover the area above the peripheral circuitry of the ASIC with pixels in order to be sensitive to radiation in this region as well.

In an embodiment, one sensor tile is connected to multiple ASICs. Typically in this case, the pixels and input contacts of the ASIC are electrically connected to each other in a one-to-one relationship.

Figure 2:
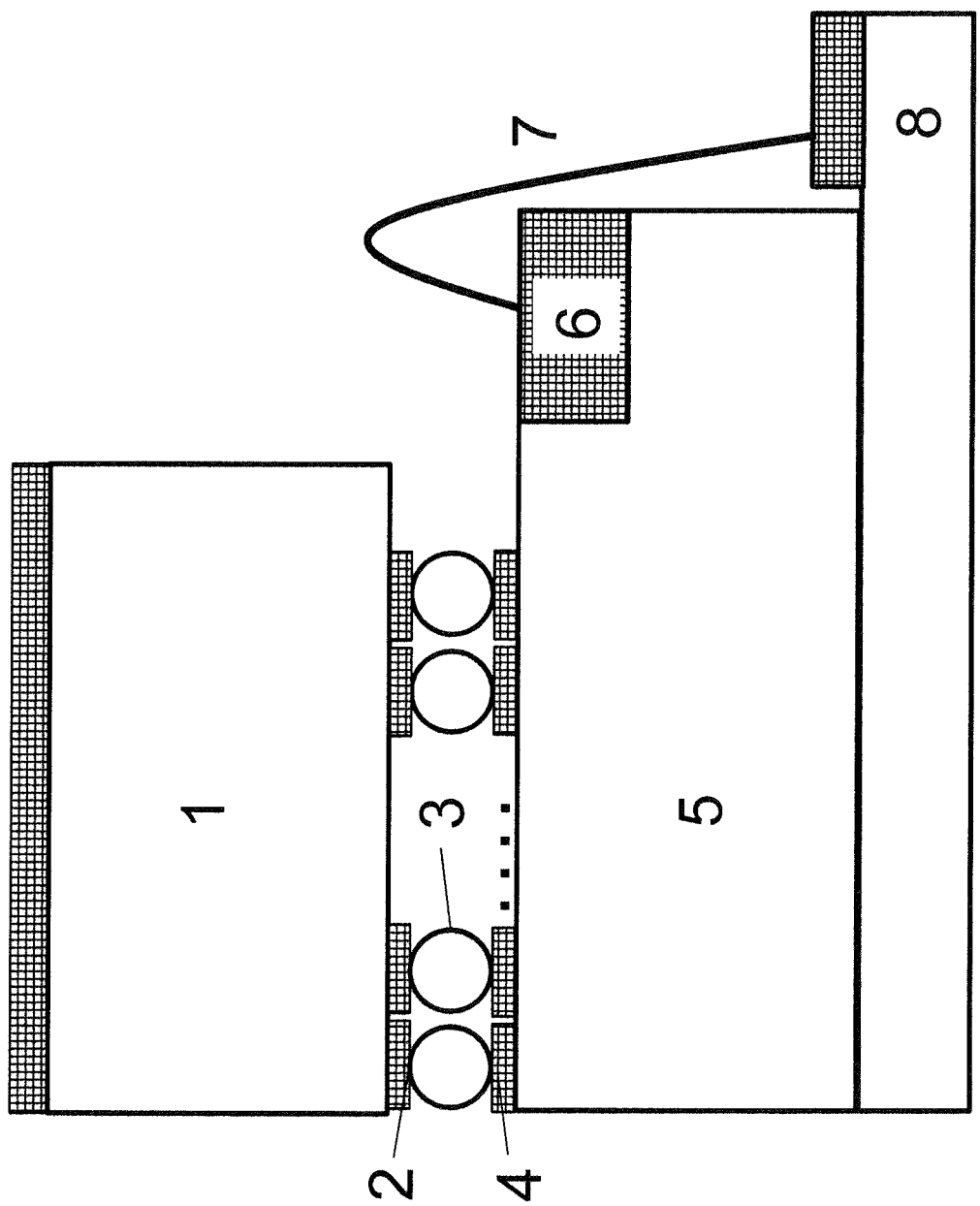
FIG. 2 shows a cross-section through a radiation detector module with a pixelated sensor and a pixelated ASIC as in FIG. 1.

As shown in FIG. 2, pixels 2 and corresponding input contacts 4 are conventionally located directly above/below each other, wherein a vertical above/below direction is defined as perpendicular to an extension of the sensor tile 1 and the pixel array in a horizontal plane. Typically the electrical connection is established by solder balls or bump bonding 3.

The radiation detector module in FIG. 2 is mounted to a high density interconnect (HDI) printed circuit board 8 with read out electronics. In the state of the art, the electrical connection between the I/O pads 6 of the ASIC 5 and the HDI PCB 8 is established by wire bonds 7.

Figure 3A:
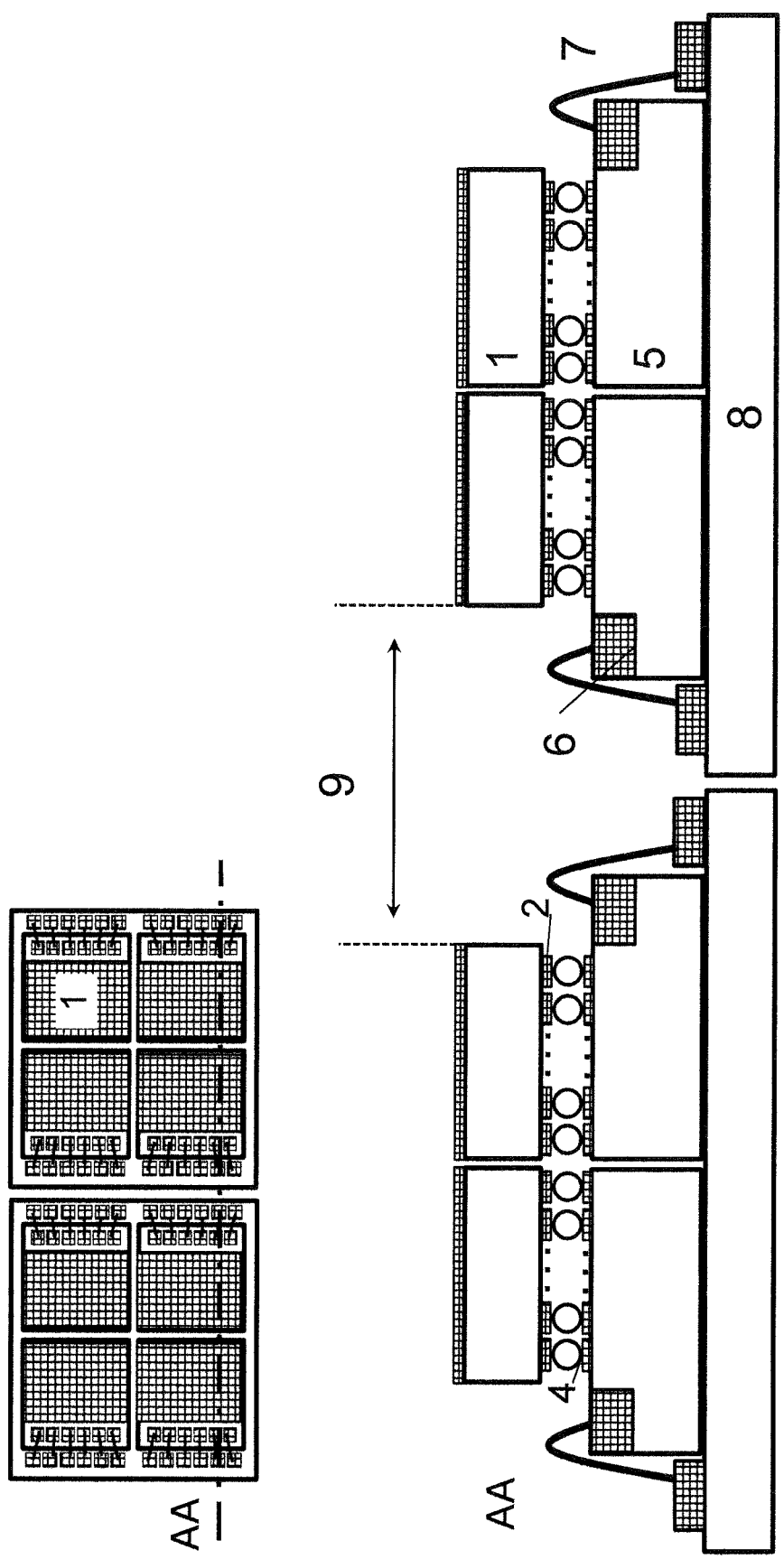
FIGS. 3a and 3b show detector modules of a radiation detector.
Figure 3B:
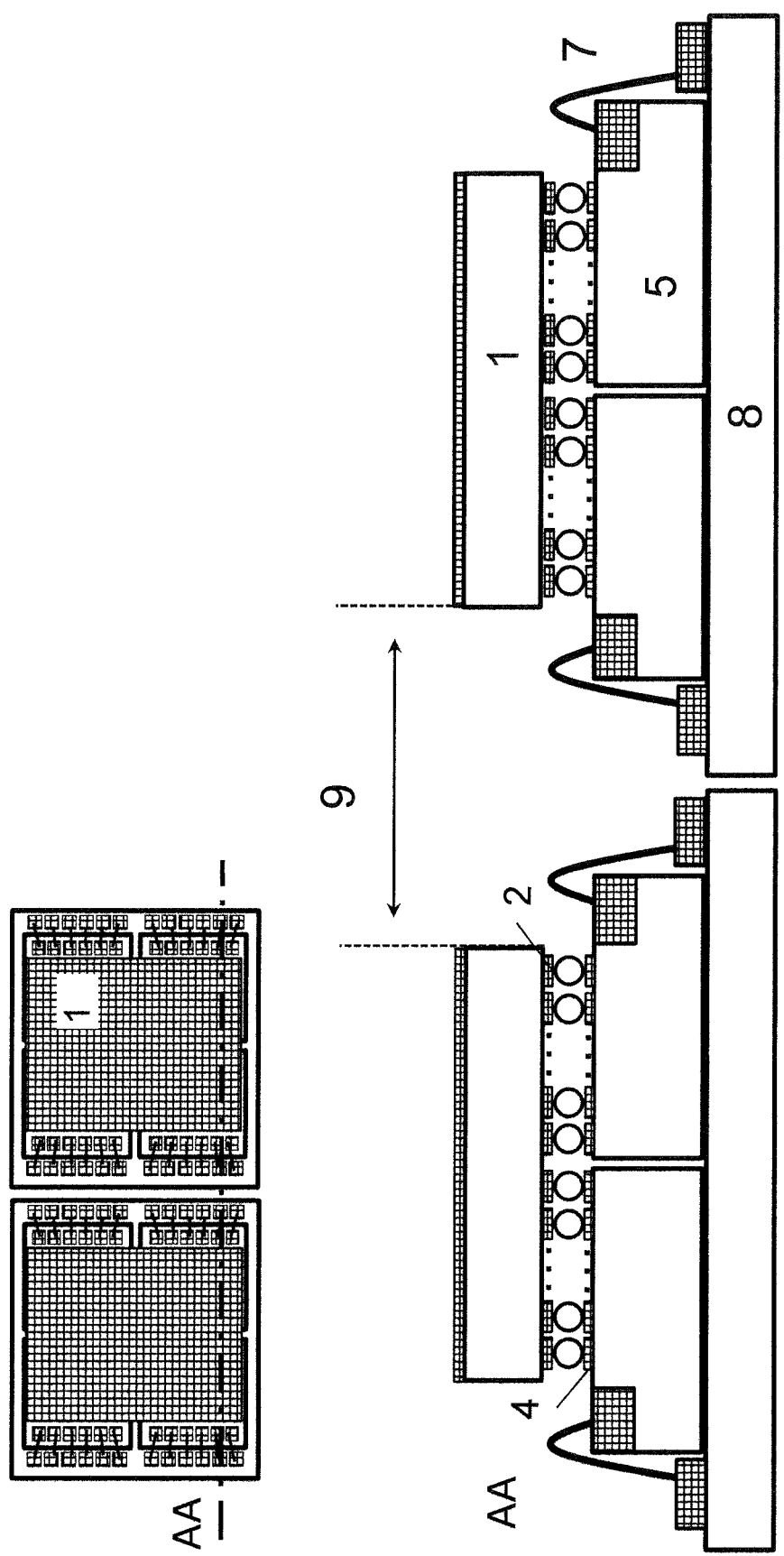

For larger detector area, several radiation detector modules as the one in FIG. 2 are arranged side by side, forming a radiation detector as shown in FIGS. 3a and 3b. As can be seen from FIGS. 2, 3a and 3b, arranging state-of-the-art detector modules side by side on the PCB 8 results in gaps 9 between the sensor tiles 1. Hence the radiation detector in the state of the art exhibits gaps 9 in the horizontal plane, where no sensor material is placed, meaning that no radiation or photons are detected in these gaps 9. This leads to a loss of details in a resulting image and a loss of measured signals. In FIG. 3a, one sensor tile is attached to each ASIC; while in FIG. 3b, one sensor tile is connected to multiple ASICs. In FIG. 3a, a further smaller gap is thus formed between tiles within the same detector module. This gap is omitted in FIG. 3b. However, in this case, usually the pixels in the region between two ASICs have a larger pitch than regular pixels.

In order to avoid these drawbacks, a solution in form of a redistribution layer between the pixels 2 and the input contacts 4 is suggested. This solution is shown in FIGS. 4 to 7.

Figure 4:
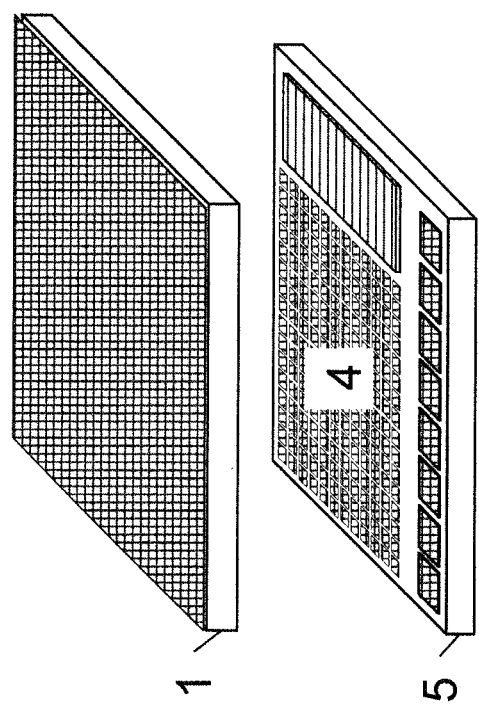
FIG. 4 shows an exploded view of a radiation detector according to the state of the art.
Figure 5:
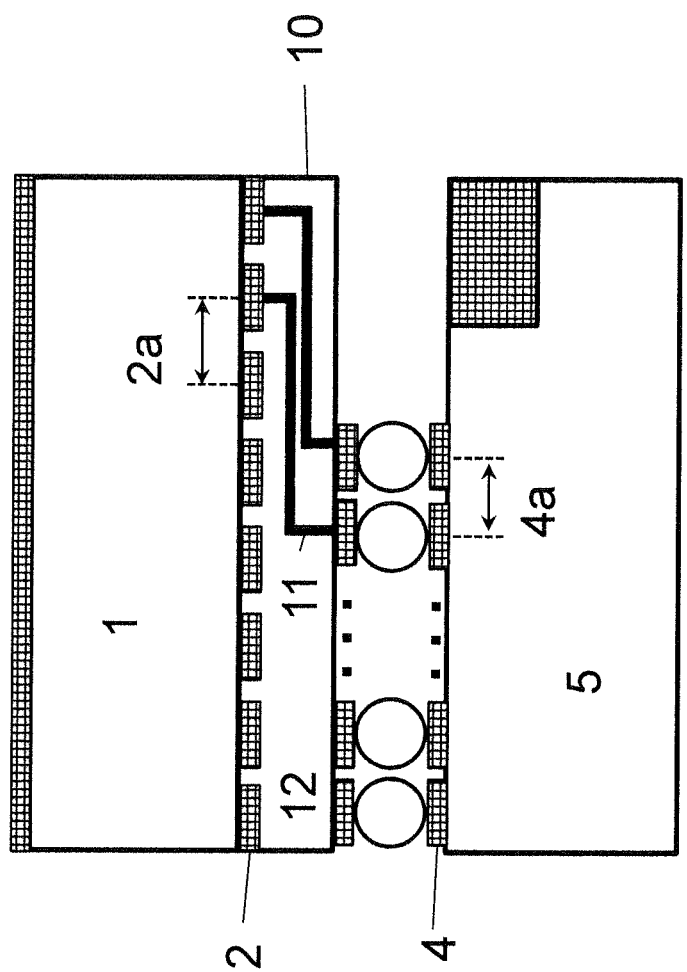
FIG. 5 shows a cross-section through a radiation detector with redistribution layer according to the state of the art.

FIG. 4 shows an exploded view of a radiation detector module, which is composed of a sensor tile 1 and an ASIC 5 with similarities with those displayed on FIG. 1. In contrast to FIG. 1, however, the pixelated sensor tile 1 of the embodiment of FIG. 4 has the same size in the horizontal plane as the ASIC 5. This leads to the situation that the pixels 2 in contact with the sensor material of the sensor tile 1 occupy a larger area than corresponding input contacts 4 of the ASIC 5. As depicted in FIG. 5, the ASIC input contacts pitch, i.e. a distance between neighboring input contacts 4, is smaller than the sensor pixel pitch 2a, i.e. a distance between neighboring pixels 2 on the sensor tile 1. In such arrangement, at least some of the input contacts 4 are necessarily offset relative to the corresponding pixels 2.

FIG. 5 also shows a solution from the state of the art, comprising a redistribution layer 10, which establishes the one-to-one connection of pixels 2 with corresponding input contacts 4 through conductor tracks 11 in a dielectric material 12. Typically, the redistribution layer 10 is monolithically integrated on the sensor tile 1.

Figure 6:
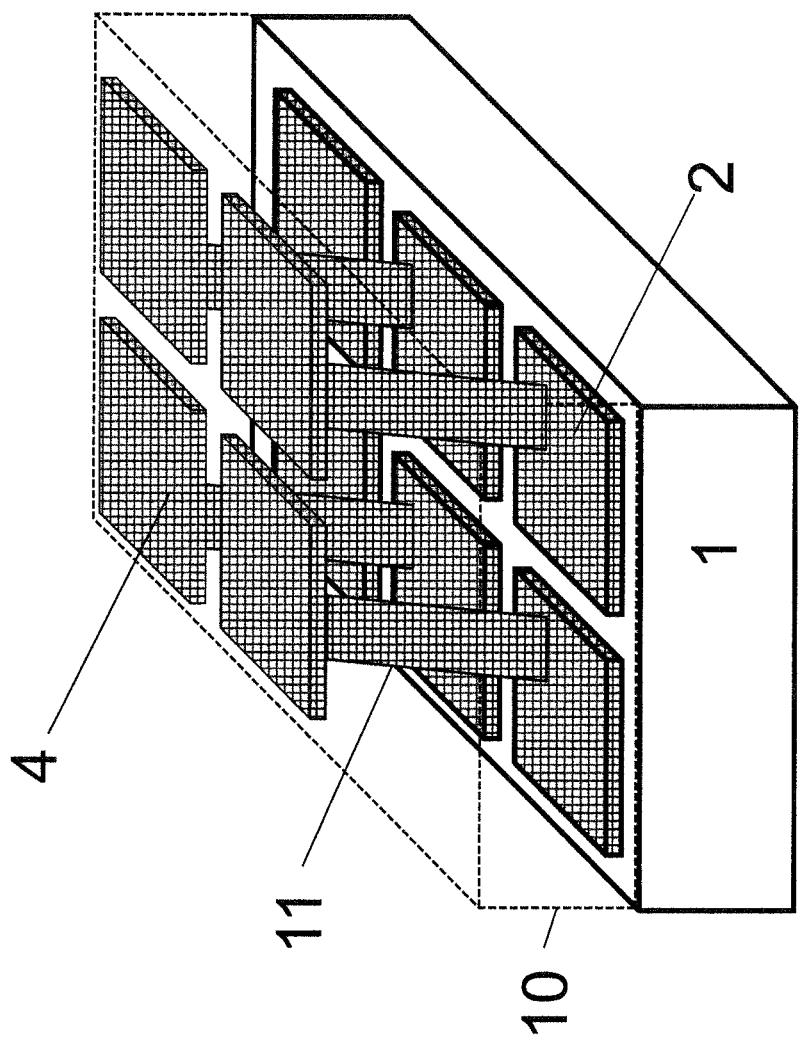
FIG. 6 shows a perspective view on the redistribution layer of a radiation detector according to the state of the art.
Figure 7:
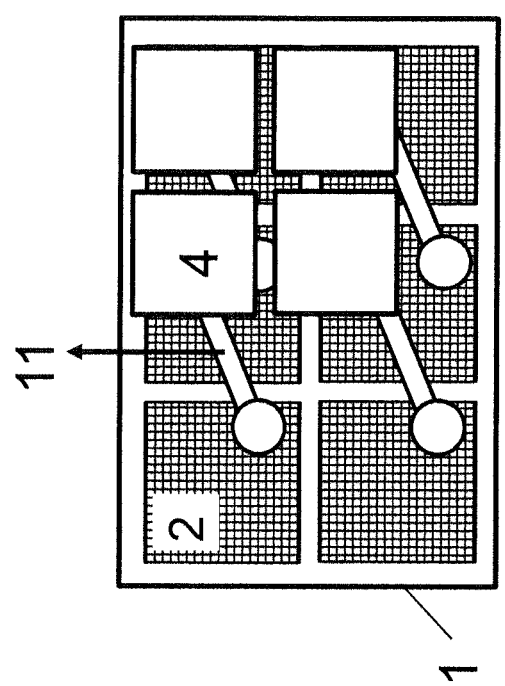
FIG. 7 shows a top view on the redistribution layer of FIG. 6.

FIGS. 6 and 7 show a perspective view and a top view, respectively, on the redistribution layer 10. Note that the vertical direction in FIGS. 6 and 7 is reversed compared to the previous figures. The conductor tracks 11 in FIGS. 6 and 7 are depicted as diagonal features connecting the pixels 2 and the input contacts 4 on the shortest path possible. In a typical implementation of a radiation detector, however, the conductor tracks 11 follow the horizontal and vertical directions as sketched in FIG. 5 due to the manufacturing process.

Figure 10:
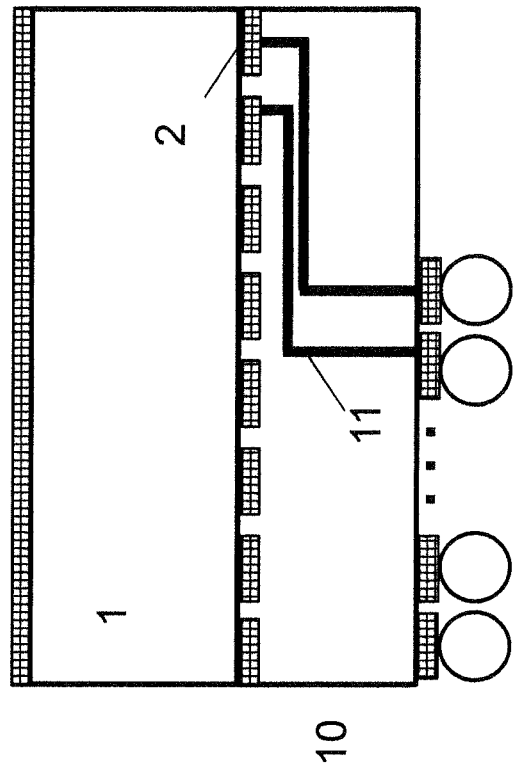
FIG. 10 shows a cross-section similar to FIG. 9 but with a greater thickness of the redistribution layer according to an embodiment of the invention.

The arrangement of electrically conducting pixels 2, conductor tracks 11 and input contacts 4 as shown in FIGS. 5 to 7 leads to the formation of capacitances, e.g. between a certain pixel 2 and a conductor track 11 crossing the pixel in the dielectric redistribution layer 10. Such capacitance is schematically depicted in FIG. 10. It leads to cross-talk between pixels, lowers the signal-to-noise ratio and generates blurring of a resulting image, hence decreasing the effective resolution. Thus the capacitance is undesired and called a "parasitic" capacitance.

Figure 8:
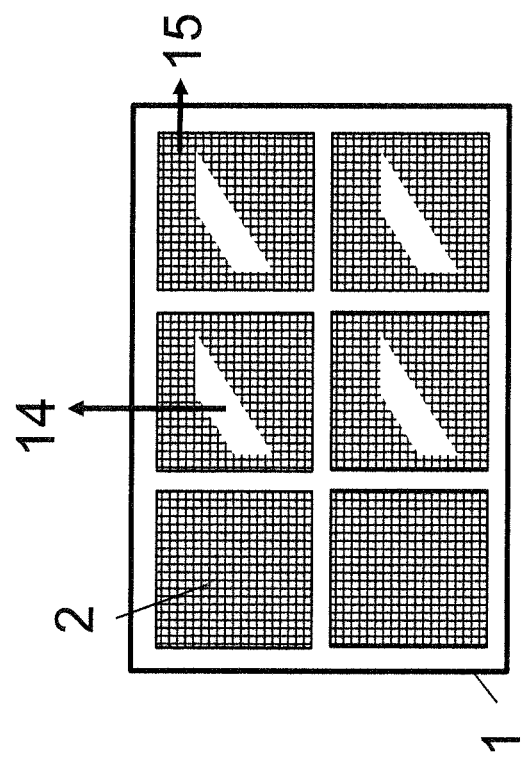
FIG. 8 shows a top view on representative six pixels of a radiation detector according to an embodiment of the invention.

FIGS. 8 to 19 show solutions to the described problem according to embodiments of the invention. FIG. 8 is a top view on six representative pixels 2 of a sensor tile 1 as used in a detector according to an embodiment of the present invention. While the pixels of a state-of-the-art detector (FIGS. 1 to 7) are continuous in the horizontal plane, i.e. are represented by a continuous electrically conducting material, at least one pixel 2 according to the invention comprises a void 14. The void 14 corresponds to at least a portion of a projection of the conductor track 11 crossing the pixel 2. The projection is advantageously made in the vertical direction. In this way, parasitic capacitances 13 are minimized or avoided by minimizing or avoiding an overlap between pixels 2 and conductor tracks 11. It is evident that a size and shape of the void 14 are specific and potentially different for each pixel 2.

The voids 14 of FIG. 8 do not fully correspond to the projections of the conductors 11. Rather, the pixels 2 retain their outer rectangular or quadratic shape from the state of the art. This means the pixels 2 have continuous edges 15 made from electrically conducting material. Such continuous edge 15 avoids that a pixel 2 is divided into several independent parts which may be on different electrical potentials. The electric field distribution inside the sensor ensures that a charge will even be collected in the case that it was created directly above the void 14.

In general, however, it is desired that the void 14 corresponds to as much of the projection as possible, i.e. the void 14 occupies at least e.g. 80%, in particular at least 90%, of an area of the projections. Also it is preferred that many or all of the pixels 2 which are crossed by conductor tracks 11 in the redistribution layer 10 exhibit such voids 14. This significantly improves the quality of the resulting image.

Alternatively or in addition, it is advantageous to apply the concept of the voids to capacitances forming between conductor tracks 11 and input contacts 4 crossed by the conductor tracks. In this case, at least one crossed input contact has a void corresponding to at least a portion of projections of the conductor tracks.

FIGS. 9 to 12 display further advantageous features of a radiation detector according to the invention. The embodiment shown in the cross-section of FIG. 9 through a sensor tile 1 and a redistribution layer 10 is characterized by a low-k material as dielectric material 12 of the redistribution layer 10. By using a low-k material, it is possible to reduce parasitic capacitances 13 as can be seen from the generic formula for the capacitance of a parallel-plate capacitor above. Thus the embodiment of FIG. 9 may have a thickness of the redistribution layer 10 in the range of 0.1 to 2 µm, e.g. 1 µm, while still reducing parasitic capacitances 13 to an acceptable level for imaging purposes.

Figure 9:
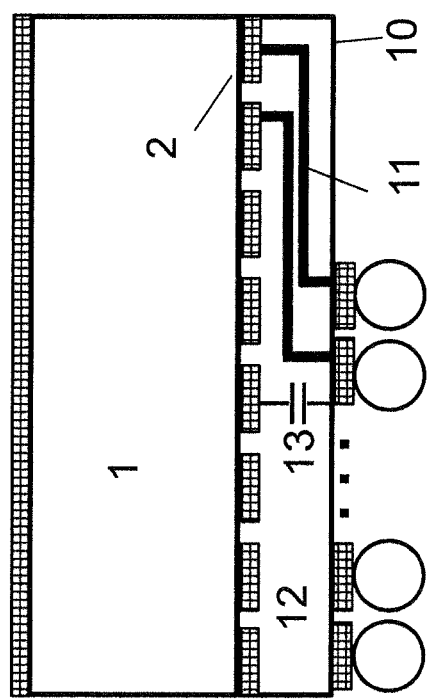
FIG. 9 shows a cross-section through a tile and a redistribution layer of a radiation detector according to an embodiment of the invention.

FIG. 10 shows a cross-section similar to FIG. 9 but with a greater thickness of the redistribution layer 10. The thickness may be in the range of 2 to 10 µm, e.g. 5 µm. Also enlarging the thickness of the redistribution layer 10 reduces parasitic capacitances as can be understood with the above formula for a parallel-plate capacitor, since it enlarges the distance between conductor tracks 11 and crossed pixels 2. Nevertheless, arbitrary increments of the redistribution layer thickness may yield an enhancement of both the conductor tracks resistance and self-capacitance. Furthermore, the required thickness range may lead to undesired complications of the fabrication process.

Figure 11:
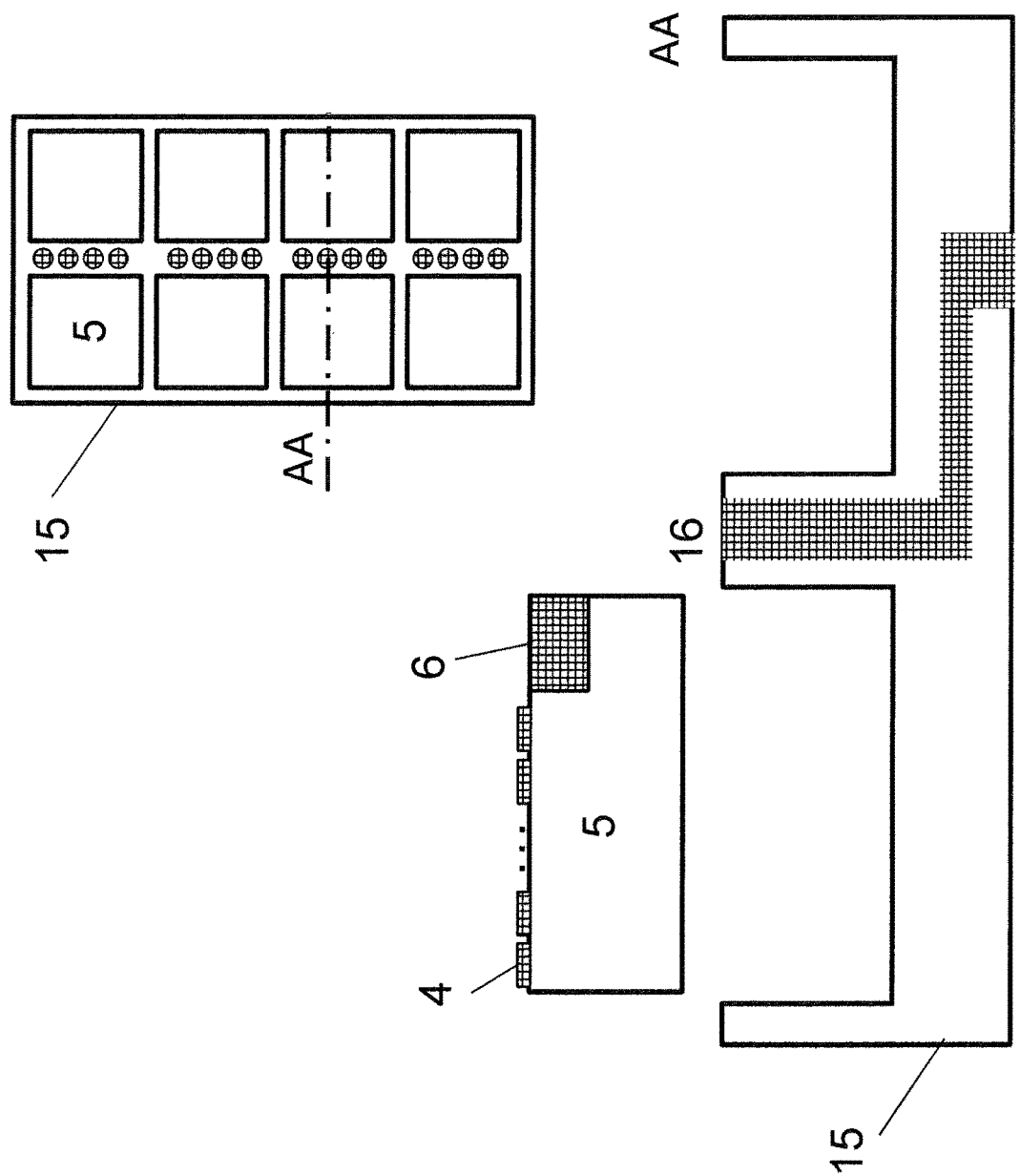
FIG. 11 shows a cross section of a the assembly of an ASIC within a substrate according to an embodiment of the invention.
Figure 12:
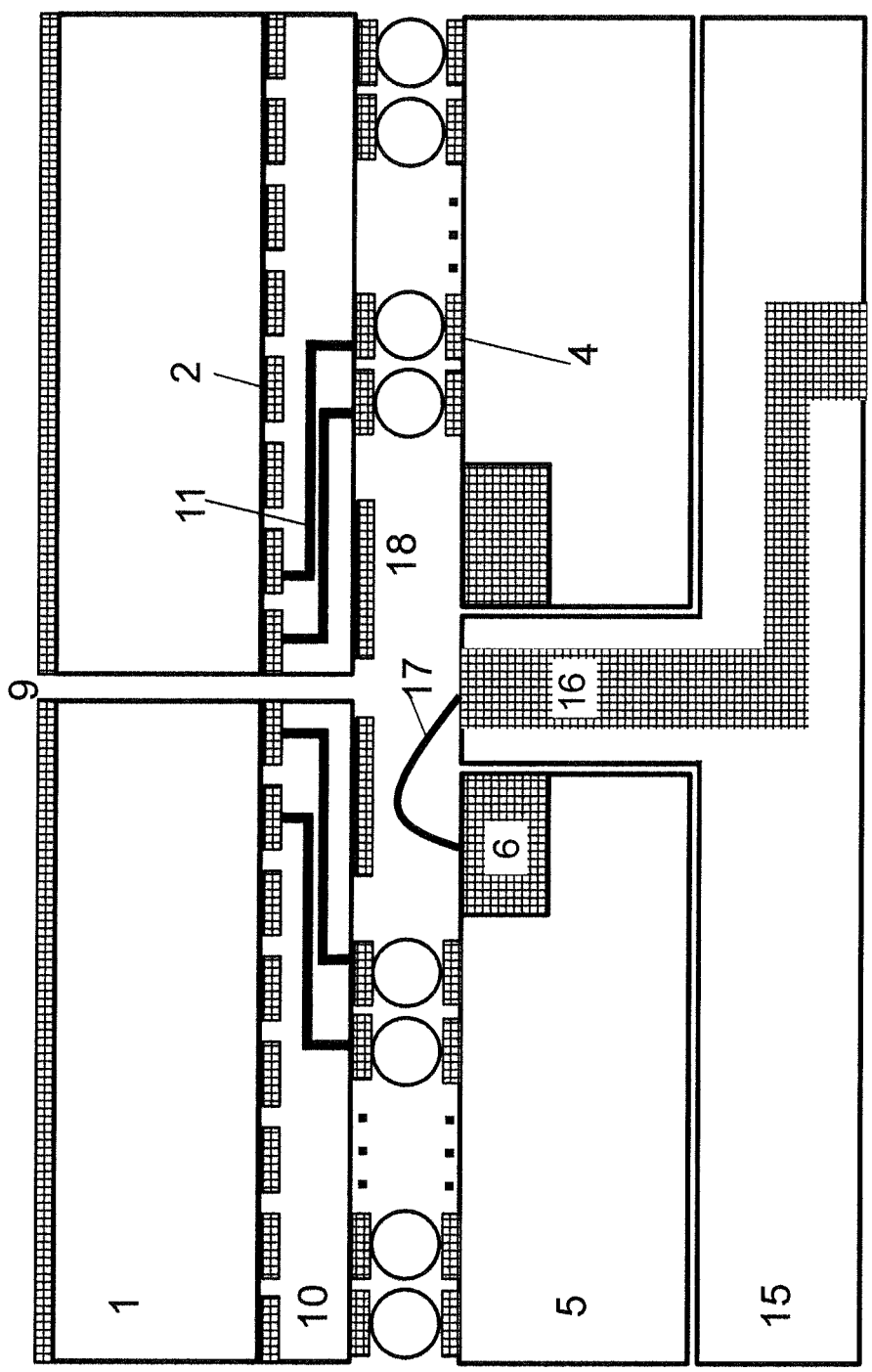
FIG. 12 shows a cross-section of a radiation detector with a substrate according to the embodiment of FIG. 11.
Figure 15B:
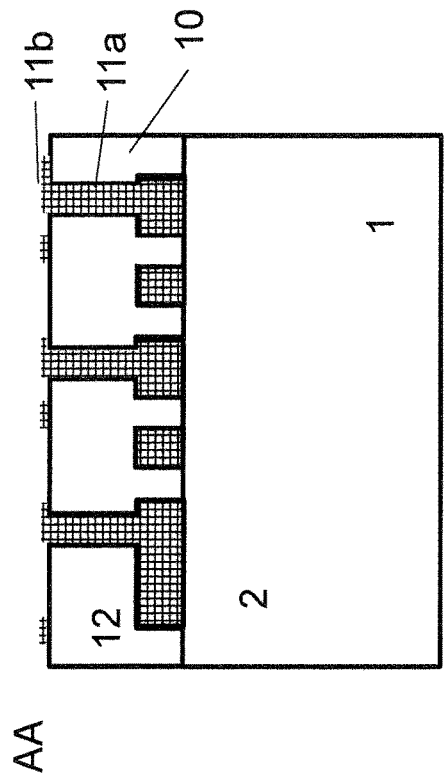

FIGS. 11 and 12 show a cross-section of a radiation detector with a substrate 15 according to an embodiment of the invention. FIG. 11 shows the assembly of ASICs 5 into the functionalized substrate 15, where FIG. 12 displays the assembled ASICs 5 inside the functionalized substrate 15 together with the bump bonded sensors with redistribution layer 10. In conventional radiation detectors, the signal is transported through wire bonds 7 to the readout electronics 8, see e.g. FIGS. 2 and 3, which leads to gaps 9 in the detector active area. According to the embodiment of the invention of FIGS. 11 and 12, the ASIC 5 is mounted to a substrate 15, in particular into a pocket of the substrate 15. Further, I/O pads 6 of the ASIC 5 are connected, via a connection 17, to external conductive vias 16 in the substrate 15, which preferably is a dielectric functionalized substrate 15. The connection 17 may e.g. be established by printed micro wire, tab bonding or wire bonding. The dimensions of the substrate pockets and/or the vias 16 are optimized in order to minimize the detector gaps 9. In this way, a radiation detector or a detector module is achieved that is well-suited for imaging, e.g. in medical applications.

FIG. 12 shows another advantageous feature: a shield 18 is arranged on the redistribution layer 10 and faces the ASIC 5. The shield 18 faces an area of the ASIC 5 that is not covered by input contacts 4, but preferably faces the I/O pad 6 and/or the via 16 and/or the connection 17. Thus it shields the conductor tracks 11 from cross talk signals originating in the digital or analog signals in the connection 17. The shield 18 may be made from a metal layer and preferably be covered by a dielectric layer or coating in direction towards the ASIC 5. Further, the shield 18 is preferably connected to a ground pad of the ASIC 5 or the substrate 15. In different embodiment, the shield 18 is arranged on the ASIC 5 facing the redistribution layer 10.

a shield (18) between the redistribution layer (10) and the at least one ASIC (5), which shield (18) is preferably arranged on the surface of the redistribution layer (10) facing the at least one ASIC (5), and preferably facing at least one of an I/O pad (6) of the ASIC (5) or a conductive via (16) of an electric insulator substrate (15) holding the ASIC (5), and in particular is electrically conducting and is connected to ground.

Figure 16B:
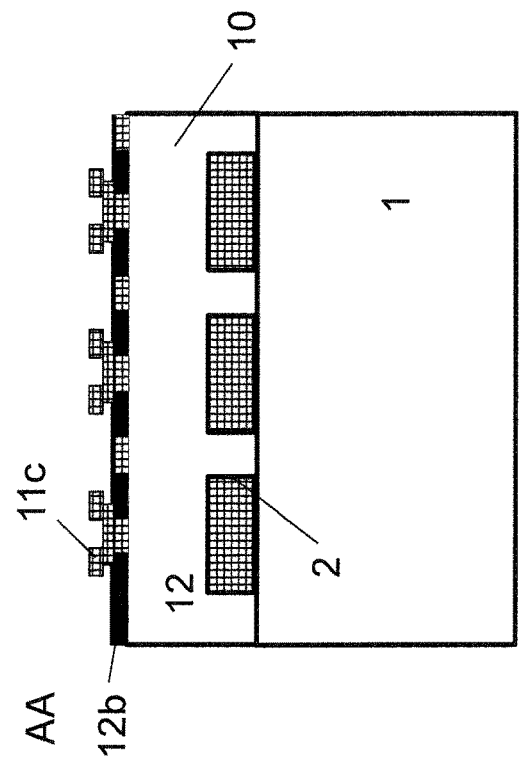
Figure 15A:
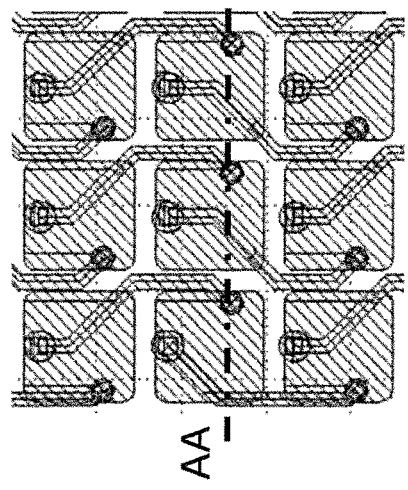
Figure 16A:
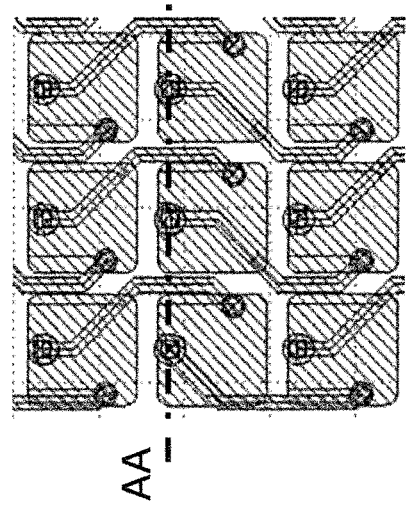
Figure 18:
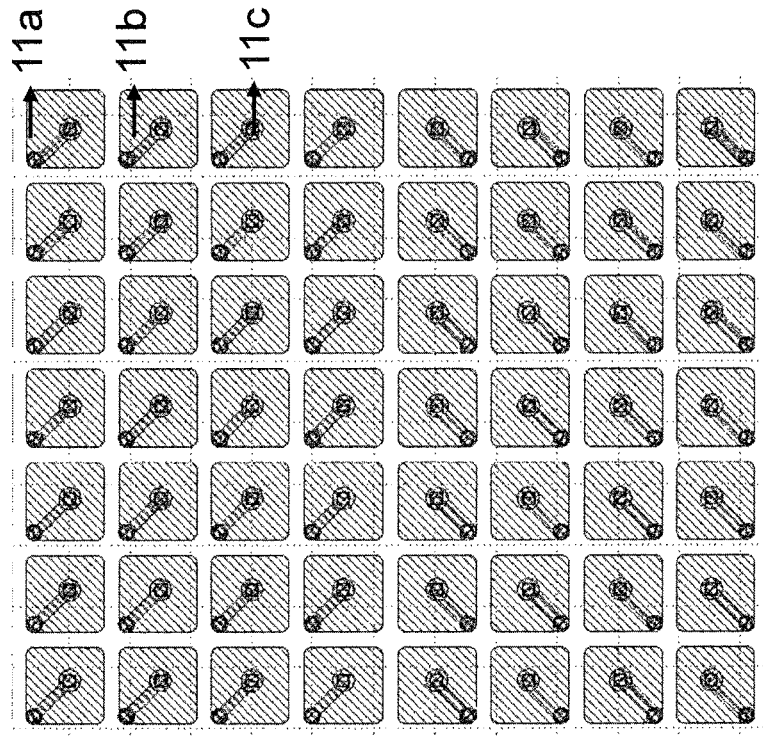
FIGS. 17 and 18 show photolithography masks for redistribution tracks and vias in an outer part and an inner part of a tile of a radiation detector according to an embodiment of the invention.
Figure 17:
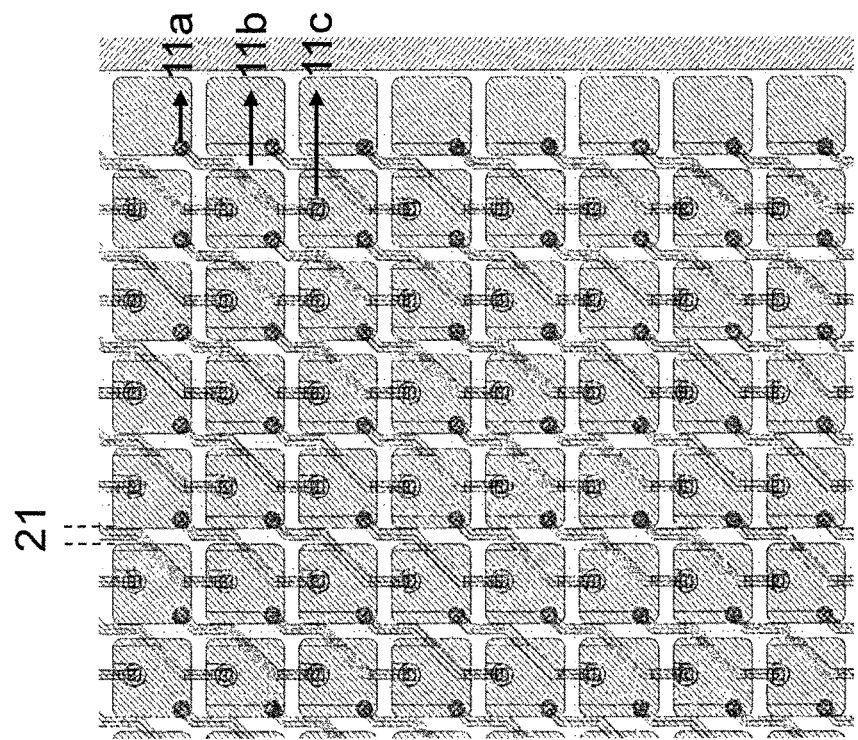

FIGS. 13 to 16 show features of a method of manufacturing a radiation detector according to embodiments of the invention. In this context, FIGS. 13a to 16a as well as FIGS. 17 and 18 show photolithography masks used in the method. In the first step, a sensor tile 1 is provided, i.e. comprising sensor material sensitive to the radiation. Then, metal pixels 2 are defined by photolithography and metallization, see FIGS. 13a and 13b. The pixels 2 have voids 14 corresponding to at least portions of projections of conductor tracks crossing the pixels as described before. In the next step (FIGS. 14a and 14b), a dielectric coating layer 12 is deposited on the sensor tile 1 and the pixels 2. Then, via holes 12a are opened through the dielectric coating layer 12 to every pixel 2. The holes 12a are defined by photolithography and formed by etching.

In the next step (FIGS. 15a and 15b), redistribution tracks 11b are defined by photolithography and metallization. In the same step, the holes 12a are filled by a conducting material forming vias 11a. The vias 11a and the redistribution tracks 11b contribute to the conductor tracks 11 of the redistribution layer 10. Then, the surface of the dielectric coating layer 12 is passivated, e.g. with a thin dielectric layer 12b of e.g. SiO2, SU8 or SiNx, and UBM 11c are defined by photolithography and metallization (FIGS. 16a and 16b). The UBM 11c are adapted to establish an electrical contact to the input contacts 4 of the ASIC 5. The dielectric coating layer 12, the thin dielectric layer 12b and the conductor tracks 11 contribute to the redistribution layer 10.

FIGS. 17 and 18 show photolithography masks for vias 11a, redistribution tracks 11b and UMB 11c in an outer part and an inner part, respectively, of a sensor tile of a radiation detector as used in an embodiment of the method. Evidently, in the outer part of the sensor 1 (FIG. 17), pixels 2 and corresponding input contacts 4, and thus vias 11a and UBM 11c, are further horizontally offset than in the inner part of the sensor tile 1 (FIG. 19). This means that redistribution tracks 11b will be longer in the outer part than in the inner part. In other words, there is maximum redistribution at the sensor edges, whereas there is minimum sensor redistribution in the sensor middle.

In general, it is advantageous that conductor tracks 11, and in particular redistribution tracks 11b, are routed such that their projections cover an as-small-as-possible area of the pixels 2. Assuming a constant desired area of the redistribution tracks 11b, this amounts to routing the redistribution tracks 11b along gaps 21 between the pixels 2 as can be seen in FIG. 17. This again reduces parasitic capacitances between different pixels or input contacts, respectively.

While there are shown and described presently preferred embodiments of the invention, it is to be distinctly understood that the invention is not limited thereto but may be otherwise variously embodied and practiced within the scope of the following claims.

The invention claimed is:

1. Radiation detector for position-resolved detection of radiation, comprising
    at least one sensor tile with sensor material sensitive to the radiation, the sensor tile defining a horizontal plane,
    a set of pixels of electrically conducting material in contact with the sensor material,
    at least one ASIC assigned to the at least one sensor tile with input contacts in electrical connection with the pixels, wherein at least one input contact is horizontally offset relative to a corresponding pixel,
    a redistribution layer between the at least one sensor tile and the at least one ASIC, the redistribution layer comprising conductor tracks electrically connecting the input contacts with the corresponding pixels,
    wherein at least one of the conductor tracks crosses at least one crossed pixel different from the corresponding pixel,
    wherein the at least one crossed pixel has a void of the electrically conducting material corresponding to at least a portion of a projection of the crossing conductor track.

2. Radiation detector according to claim 1,
    wherein the sensor material is adapted to convert incident radiation to electrical charge, and
    wherein the sensor material comprises silicon or gallium arsenide or cadmium telluride or cadmium zinc telluride.

3. Radiation detector according to claim 1,
    wherein the at least one sensor tile, in its projection on the at least one ASIC assigned, protrudes over at least one edge of the at least one ASIC.

4. Radiation detector according to claim 3,
wherein the at least one sensor tile has a larger surface area in the horizontal plane than the at least one ASIC assigned,
wherein a horizontal extension of the set of pixels is larger than the extension of the array of input contacts,
wherein each sensor tile has a surface area of at least 2 cm×2 cm.

5. Radiation detector according to claim 1,
wherein each pixel of the set is assigned to one input contact of the number of input contacts, and
wherein each pixel of the set is electrically connected by one of the conductor tracks to the assigned input contact.

6. Radiation detector according to claim 1
wherein the at least one of the conductor tracks crossing at least one crossed pixel different from the corresponding pixel is the conductor track electrically connecting the at least one input contact horizontally offset relative to the corresponding pixel.

7. Radiation detector according to claim 1, comprising
inter-pixel-gaps of non-electrically conducting material between neighboring pixels,
wherein at least a portion of at least one of the conductor tracks is aligned with one of the inter-pixels-gaps.

8. Radiation detector according to claim 7,
wherein the horizontal offset between the at least one input contact and the corresponding pixel refers to a location of the input contact and a location of a termination point within an area of the corresponding pixel of the corresponding conductor track,
wherein for at least two pixels of the set the location of the termination point within the corresponding pixel is different.

9. Radiation detector according to claim 8, wherein all of the termination points are located at the edges of the corresponding pixel areas.

10. Radiation detector according to claim 1,
wherein an area of the void amounts to at least 80% of an area of the projection defining the portion of the projection.

11. Radiation detector according to claim 1,
wherein the void is delimited by continuous edges of electrically conducting material.

12. Radiation detector according to claim 1,
wherein the redistribution layer has a thickness of at least 1 μm.

13. Radiation detector according to claim 12,
wherein the conductor tracks and the input contacts of the at least one ASIC are connected via solder bumps and under bump metallizations.

14. Method according to claim 13, compromising electrically connecting at least one I/O pad of the at least one ASIC to the at least one external conductive via by printed micro wire or by tape automated bonding or by wire bonding or by UTEC.

15. Radiation detector according to claim 1, comprising
a set of sensor tiles arranged adjacent to each other in the horizontal plane, wherein the tiles are separated by gaps,
wherein an overall surface of the gaps in the horizontal plane is smaller than 10 of an overall surface of the sensor tiles.

16. Radiation detector according to claim 1 further comprising
a substrate for holding and contacting the at least one ASIC,
wherein the substrate comprises an electric insulator substrate and at least one conductive via through the insulator substrate per ASIC, and
wherein an at least one I/O pad of the at least one ASIC is electrically connected to the at least one conductive via, by a printed micro wire or by tape automated bonding or by wire bonding.

17. Radiation detector according to claim 1, further comprising
a shield between the redistribution layer and the at least one ASIC, which shield is arranged on the surface of the redistribution layer facing the at least one ASIC, and facing at least one of an I/O pad of the ASIC or a conductive via of an electric insulator substrate holding the ASIC, and is electrically conducting and is connected to ground.

18. Radiation detector according to claim 17,
wherein a projection of the shield covers at least 50%, of a surface area of the redistribution layer that is not covered by input contacts.

19. Method of manufacturing a radiation detector, comprising the steps of
providing at least one sensor tile with sensor material sensitive to the radiation,
forming a set of pixels of electrically conducting material in contact with the sensor material,
depositing a dielectric coating layer, contributing to a redistribution layer,
etching a via hole per pixel into the dielectric coating layer,
forming conductor tracks by filling the via holes with an electrically conducting material and defining redistribution tracks on the dielectric coating layer,
defining contacts of the conductor tracks and depositing another dielectric coating layer on the redistribution tracks, the other dielectric coating layer also contributing to the redistribution layer,
electrically connecting the contacts of the conductor tracks to input contacts of at least one ASIC,
wherein at least one input contact is horizontally offset relative to a corresponding pixel,
wherein at least one of the conductor tracks crosses at least one crossed pixel different from the corresponding pixel,
wherein at least one crossed pixel has a void of the electrically conducting material corresponding to at least a portion of the projection of the conductor track.

20. Method according to claim 19, comprising the steps of
providing a substrate for holding and contacting the at least one ASIC, wherein the substrate comprises an electric insulator substrate and at least one external conductive via through the electric insulator substrate per ASIC,
mounting the at least one sensor tile and the at least one ASIC to the substrate.

* * * * *